(12) United States Patent
Du

(10) Patent No.: US 12,008,299 B2
(45) Date of Patent: Jun. 11, 2024

(54) BUFFER INSERTION METHOD AND DEVICE, STORAGE MEDIUM, AND ELECTRONIC DEVICE

(71) Applicant: CHANGXIN MEMORY TECHNOLOGIES, INC., Anhui (CN)

(72) Inventor: Tao Du, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 220 days.

(21) Appl. No.: 17/806,975

(22) Filed: Jun. 15, 2022

(65) Prior Publication Data

US 2023/0259682 A1    Aug. 17, 2023

Related U.S. Application Data

(63) Continuation of application No. PCT/CN2022/080580, filed on Mar. 14, 2022.

(30) Foreign Application Priority Data

Feb. 15, 2022   (CN) .......................... 202210137597.9

(51) Int. Cl.
G06F 30/373   (2020.01)
G06F 30/27    (2020.01)
G11C 11/401   (2006.01)

(52) U.S. Cl.
CPC ............ *G06F 30/373* (2020.01); *G06F 30/27* (2020.01); *G11C 11/401* (2013.01)

(58) Field of Classification Search
USPC ........................................................ 716/100
See application file for complete search history.

(56) References Cited

U.S. PATENT DOCUMENTS 10,963,620 B1 *  3/2021  Ding ..................... G06F 30/398
2013/0145337 A1 *  6/2013  Iyer et al. ........... G06F 30/3312
                                                        716/134

FOREIGN PATENT DOCUMENTS

CN           112257378 A     1/2021

* cited by examiner

*Primary Examiner* — Bryce M Aisaka
(74) *Attorney, Agent, or Firm* — Syncoda LLC; Feng Ma

(57) ABSTRACT

In a method for buffer insertion, a circuit to be processed and a plurality of insertion strategy parameters are determined; a target insertion strategy parameter is determined by calculating the plurality of insertion strategy parameters by using a preset population genetic model; and a target circuit is obtained by performing buffer insertion processing on the circuit to be processed according to the target insertion strategy parameter.

20 Claims, 10 Drawing Sheets

BUFFER INSERTION METHOD AND DEVICE, STORAGE MEDIUM, AND ELECTRONIC DEVICE

CROSS-REFERENCE TO RELATED APPLICATIONS

This application is a continuation of International Application No. PCT/CN2022/080580 filed on Mar. 14, 2022, which claims priority to Chinese Patent Application No. 202210137597.9 filed on Feb. 15, 2022. The disclosures of these applications are hereby incorporated by reference in their entirety.

BACKGROUND

A Dynamic Random Access Memory (DRAM) is a semiconductor memory commonly used in a computer. During a design process of the DRAM, a circuit device and an idealized delay need to be designed according to functional requirements first, and then a timing sequence and a delay of a signal are adjusted. During adjusting the timing sequence and the delay, some signals need to be transmitted through a very long transmission path, so a buffer needs to be inserted into the transmission path to ensure the signal transmission speed and the signal transmission quality.

SUMMARY

The disclosure relates to the technical field of integrated circuits, and in particular, to a method and device for buffer insertion, a storage medium, and an electronic device.

Technical solutions of the embodiments of the disclosure are implemented as follows.

In an embodiment, the embodiment of the disclosure provides a method for buffer insertion. The method includes the following operations.

A circuit to be processed and a plurality of insertion strategy parameters are determined. A target insertion strategy parameter is determined by calculating the plurality of insertion strategy parameters by using a preset population genetic model. A target circuit is obtained by performing buffer insertion processing on the circuit to be processed according to the target insertion strategy parameter.

In another embodiment, the embodiment of the disclosure provides a buffer insertion device. The buffer insertion device includes a memory and a processor. The memory is configured to store a computer program executable on the processor. The processor is configured to execute the steps of the method as described in the first aspect when executing the computer program.

In another embodiment, the embodiment of the disclosure provides a computer storage medium. The computer storage medium stores the computer program, and the steps of the method as described in the first aspect are implemented when the computer program is executed.

DETAILED DESCRIPTION

Figure 1:
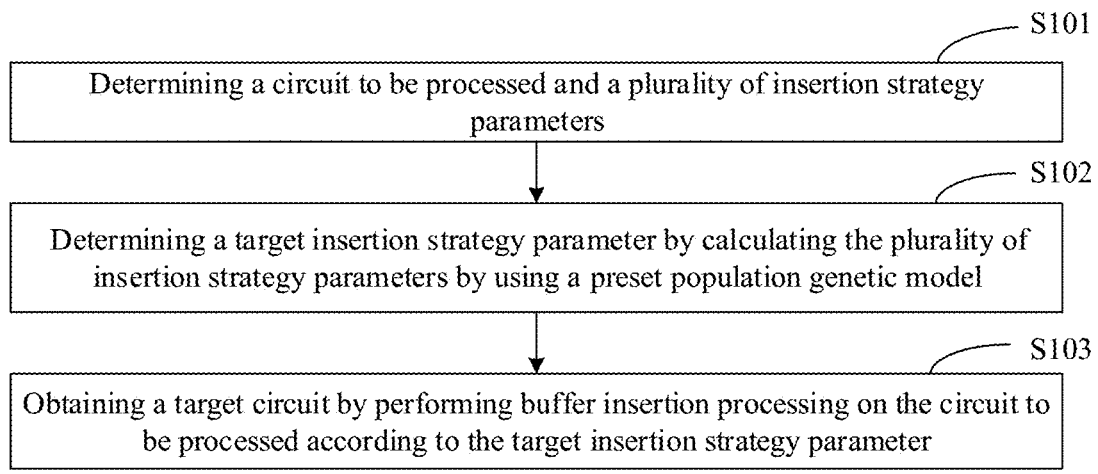
FIG. 1 illustrates a schematic flowchart of a method for buffer insertion provided by the embodiments of the disclosure.

Technical solutions in the embodiments of the disclosure are clearly and completely described below in combination with the drawings in the embodiments of the disclosure. It is to be understood that the specific embodiments described herein are merely illustrative of the disclosure and are not intended to limit the disclosure. In addition, it is also to be noted that, for ease of description, only the parts related to the relevant disclosure are illustrated in the accompanying drawings.

Unless otherwise defined, all technical and scientific terms used herein shall have the same meanings as commonly understood by those skilled in the art to which the disclosure belongs. The terms used herein are only intended to describe the embodiments of the disclosure, and are not intended to limit the disclosure.

"Some embodiments" involved in the following descriptions describes a subset of all possible embodiments. However, it is to be understood that "some embodiments" may be the same subset or different subsets of all the possible embodiments, and may be combined without conflicts.

It is to be pointed out that term "first/second/third" involved in the embodiments of the disclosure is only for distinguishing similar objects and does not represent a specific sequence of the objects. It is to be understood that "first/second/third" may be interchanged to specific sequences or orders if allowed, such that the embodiments of the disclosure described herein can be performed in a sequence other than the sequences illustrated or described herein.

In the design process of the integrated circuit, a function and an idealized delay are usually designed first, and then a timing sequence and a delay in the circuit are adjusted according to specific cases. However, many signals will be encountered during specific adjustment of the timing sequence and the delay, and the signals need to be transmitted through a long routing. At this case, a buffer needs to be added to the transmission path for these signals to ensure that the transmission speed of the signals is high and the signal quality is good after the signals reach an end point. However, when the buffer is inserted into a circuit, an experienced designer is required to evaluate the circuit and give some insertion rules of the buffer, and then the buffer insertion can be performed automatically or manually by using a software script according to the insertion rules of the buffer.

However, this method will depend on the experience of the designer and the designer needs to be familiar with a circuit process. When the circuit process is upgraded, it will bring great obstacles to designers. In addition, this method is not friendly to a less experienced designer. Moreover, even for a more experienced designer, the buffer insertion rules designed by the designer may not be able to achieve the best effect.

On this basis, the embodiments of the disclosure provide a method for buffer insertion. The method includes: determining a circuit to be processed and a plurality of insertion strategy parameters; determining a target insertion strategy parameter by calculating the plurality of insertion strategy parameters by using the preset population genetic model; and obtaining a target circuit by performing the buffer insertion processing on the circuit to be processed according to the target insertion strategy parameter. Thus, the plurality of insertion strategy parameters are optimized and selected by using the preset population genetic model to obtain the target insertion strategy parameter with a better effect, thereby quickly completing the buffer insertion for the circuit to be processed, shortening a lot of time, and having high efficiency. Furthermore, through the calculation of the preset population genetic model, the search direction of an optimal solution for a buffer insertion design can be clarified, and the obtained target insertion strategy parameter is more reasonable, such that the performance of the target circuit can be ensured and the robustness of the target circuit can be improved.

Various embodiments of the disclosure will be described in detail below with reference to the accompanying drawings.

In an embodiment of the disclosure, reference is made to FIG. 1, which illustrates a schematic flowchart of a method for first buffer insertion according to the embodiments of the disclosure. As illustrated in FIG. 1, the method may include the following steps.

At S101, a circuit to be processed and a plurality of insertion strategy parameters are determined.

It is to be noted that the embodiments of the disclosure provides a buffer insertion method, which is used to insert a buffer into a circuit to be processed, so as to ensure that various signals in the circuit to be processed are in a better working state. Furthermore, the buffer insertion method provided by the embodiments of the disclosure may be applied to a variety of electronic devices having computing functions.

Herein, the circuit to be processed may be various types of circuits, for example, a circuit in a DRAM chip. The plurality of insertion strategy parameters may be randomly generated for the circuit to be processed, and subsequently, iterative processing and selecting are performed on the plurality of insertion strategy parameters, so as to obtain an optimal target insertion strategy parameter.

In some embodiments, an insertion strategy parameter may include a buffer quantity parameter, a buffer position parameter, and a buffer size parameter.

It is to be noted that the buffer refers to a unit circuit comprising two phase inverters, and an output signal thereof is the same as an input signal. The buffer is added to the circuit to be processed, which can make the circuit to be processed have stable output resistance, better voltage transmission characteristics, and a steeper output curve.

In the embodiments of the disclosure, the buffer quantity parameter may refer to the number of buffers inserted into the circuit to be processed. The buffer position parameter may refer to a respective insertion position of each buffer, i.e., the distance between the buffer and a specified circuit node (for example, an input end of a signal). The buffer size parameter may refer to the size of a respective transistor in each buffer, for example, the width/length of an N-type Metal Oxide Semiconductor (NMOS), and the width/length of a P-type MOS (PMOS), which are used to represent the driving capability of the transistor.

Herein, the insertion strategy parameters can be encoded parameters, and specific coding rules are not limited.

At S102, a target insertion strategy parameter is determined by calculating the plurality of insertion strategy parameters by using a preset population genetic model.

It is to be noted that the insertion strategy parameters are optimized by using a genetic algorithm (or referred to as a population genetic algorithm) in the present embodiment, so as to obtain a target insertion strategy parameter with the best effect. Herein, the genetic algorithm is a method for simulating a natural evolution process to search an optimal solution, and is widely applied to the fields such as combinatorial optimization, machine learning, signal processing, adaptive control and artificial life.

In the embodiments of the disclosure, a preset population genetic model is constructed on the basis of the genetic algorithm and a task scenario for inserting a buffer into the circuit to be processed, so as to perform iterative optimization on the insertion strategy parameters by using the preset population genetic model, and finally obtain the target insertion strategy parameter. Thus, the design of buffer insertion can be performed automatically through the preset population genetic model, such that the circuit design efficiency can be improved and the time of a designer can be saved. Furthermore, a buffer insertion process does not depend on the experience of the designer any longer, and has objectivity and stability, thereby ensuring the final performance of the circuit.

Figure 2:
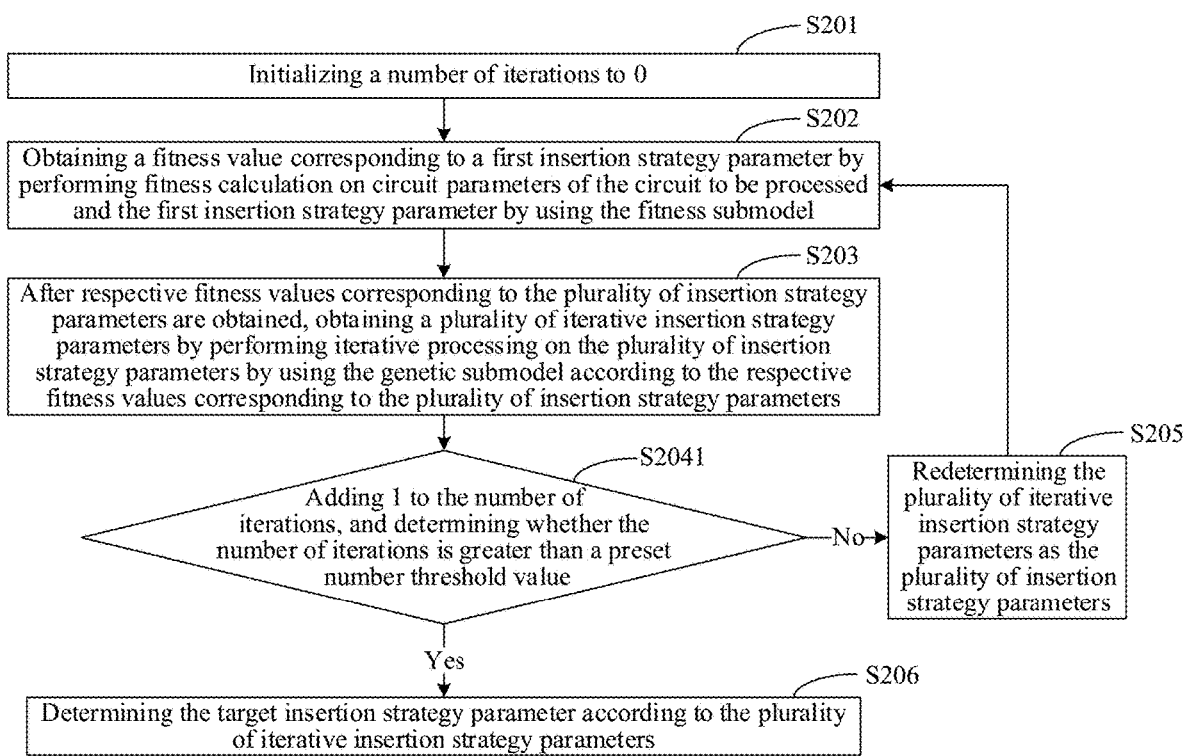
FIG. 2 illustrates a schematic flowchart of another method for buffer insertion provided by the embodiments of the disclosure.

In some embodiments, as illustrated in FIG. 2, the preset population genetic model includes a fitness submodel and a genetic submodel. The operation that the target insertion strategy parameter is determined by calculating the plurality of insertion strategy parameters by using the preset population genetic model according to the circuit parameters of the circuit to be processed includes the following steps.

At S201, the number of iterations is initialized to 0.

At S202, a fitness value corresponding to a first insertion strategy parameter is obtained by performing fitness calculation on the circuit parameters of the circuit to be processed and the first insertion strategy parameter by using the fitness submodel.

It is to be noted that the first insertion strategy parameter is any one of the plurality of insertion strategy parameters, and the circuit parameters of the circuit to be processed include at least the total length of the circuit to be processed.

That is, for the circuit to be processed, after the plurality of insertion strategy parameters are randomly generated, the respective fitness value corresponding to each insertion strategy parameter can be obtained by calculating the circuit parameters of the circuit to be processed and each insertion strategy parameter by using the fitness submodel.

Herein, the fitness submodel is configured to calculate the respective fitness value corresponding to the insertion strategy parameter, and the fitness value is an index for measuring the quality of the insertion strategy parameter. For example, in the embodiments of the disclosure, the higher the fitness value corresponding to the insertion strategy parameter, the better the effect of performing the buffer insertion according to the insertion strategy parameter.

In some embodiments, the operation that the fitness value corresponding to the first insertion strategy parameter is obtained by performing fitness calculation on a circuit parameters of the circuit to be processed and the first insertion strategy parameter by using the fitness submodel may include the following operations.

A first sub-fitness value, a second sub-fitness value, a third sub-fitness value, and a fourth sub-fitness value are obtained by calculating the circuit parameters of the circuit to be processed and the first insertion strategy parameter.

The fitness value corresponding to the first insertion strategy parameter is obtained by performing weighted summation operation on the first sub-fitness value, the second sub-fitness value, the third sub-fitness value, and the fourth sub-fitness value by using preset weight values.

It is to be noted that the fitness submodel is established according to multiple indexes for measuring the quality of a circuit design. Exemplarily, the first sub-fitness value may be a signal delay of a circuit, the second sub-fitness value may be an area of the circuit, the third sub-fitness value may be a signal pulse width of an output signal, and the fourth sub-fitness value may be the power consumption of the circuit. Exemplarily, a greater signal pulse width indicates a faster rising time/falling time of the signal, less distortion for the corresponding waveform, and greater signal quality value. Herein, the power consumption of the circuit may be determined according to a circuit current, and the greater the circuit current, the greater the power consumption value.

Generally speaking, after the buffer is inserted, it is expected that the signal delay value of the circuit is smaller, the area of the circuit is smaller, the signal pulse width is wider, and the power consumption of the circuit is lower.

In some embodiments, the preset weight values include a first weight value, a second weight value, a third weight value, and a fourth weight value. The method may further include the following operations.

The respective values of the first weight value, the second weight value, the third weight value, and the fourth weight value are set. The sum of the respective values of the first weight value, the second weight value, the third weight value, and the fourth weight value is 1.

Herein, the first weight value refers to the weight value of the first sub-fitness value. The second weight value refers to the weight value of the second sub-fitness value. The third weight value refers to the weight value of the third sub-fitness value. The fourth weight value refers to the weight value of the fourth sub-fitness value.

It is to be noted that the respective values of the first weight value, the second weight value, the third weight value, and the fourth weight value need to be specifically determined according to an actual application cases. For example, for a case where high signal delay is required, a large value may be taken as the first weight value.

Exemplarily, in a case where the first sub-fitness value is a signal delay, the second sub-fitness value is an area of the circuit, the third sub-fitness value is a signal pulse width, and the fourth sub-fitness value is the power consumption of the circuit, the fitness sub-model may be as illustrated in formula (1):

$$F(x) = A \cdot (\text{delay}) + B \cdot (\text{total size}) + C \cdot (\text{pulse width}) + D \cdot (\text{current}) \quad (1)$$

Herein, x denotes the first insertion strategy parameter, F(x) denotes a fitness value of x, delay denotes a signal delay, total size denotes the area of the circuit, pulse width denotes the signal pulse width, and current denotes the circuit current (the power consumption of the circuit). It is to be understood that A, B, C, and D are the first weight value, the second weight value, the third weight value, and the fourth weight value, respectively. The delay, the total size, the pulse width, and the current are the first sub-fitness value, the second sub-fitness value, the third sub-fitness value, and the fourth sub-fitness value, respectively.

It is to be understood that the delay, the total size, the pulse width, and the current are all obtained by calculating according to the circuit length of the circuit to be processed and the first insertion strategy parameter (x), and may represent the performance of the circuit to be processed after a buffer is inserted according to the first insertion strategy parameter. Furthermore, for a specific circuit, the signal delay, the area of the circuit, the signal pulse width, and the circuit current are not in the same unit system, and may not be in the same order of magnitude. Thus, the delay, the total size, the pulse width, and the current need to be modeled according to an actual application scenario, so as to fit the preset population genetic model of the embodiments of the disclosure. For example, the greater fitness value indicates that the insertion strategy parameter is better, so the delay may be designed as a reciprocal of a real circuit delay.

At S203, after the respective fitness values corresponding to the plurality of insertion strategy parameters are obtained, a plurality of iterative insertion strategy parameters are obtained by performing iterative processing on the plurality of insertion strategy parameters by using the genetic submodel according to the respective fitness values corresponding to the plurality of insertion strategy parameters.

It is to be noted that the performance of the plurality of insertion strategy parameters may be obtained by comparing the respective fitness values corresponding to the plurality of insertion strategy parameters. On this basis, the iterative processing is performed on the plurality of insertion strategy parameters by using the genetic submodel, so as to obtain a plurality of iterative insertion strategy parameters.

Herein, the genetic submodel is configured to regulate iteration rules, so as to obtain the iterative insertion strategy parameters.

In some embodiments, the operation that the plurality of iterative insertion strategy parameters are obtained by performing iterative processing on the plurality of insertion strategy parameters by using the genetic submodel according to the respective fitness values corresponding to the plurality of insertion strategy parameters may include the following operations.

The plurality of first intermediate parameters are obtained by selecting from the plurality of insertion strategy parameters according to the respective fitness values corresponding to the plurality of insertion strategy parameters.

A plurality of second intermediate parameters are obtained by performing crossover processing on the plurality of first intermediate parameters.

The plurality of iterative insertion strategy parameters are obtained by performing mutation processing on the plurality of second intermediate parameters.

It is to be noted that, in the embodiments of the disclosure, the iterative processing includes three main steps: selecting, crossover, and mutation. A specific process of iteration may be understood as follows: part good insertion strategy parameters (i.e., the first intermediate parameters) are selected from the plurality of insertion strategy parameters, the crossover processing is performed by using the selected first intermediate parameters to obtain the second intermediate parameters, and the mutation processing is performed on the second intermediate parameters to obtain the iterative insertion strategy parameters.

It is to be noted that, during the process of selecting, the probability of selecting each insertion strategy parameter is in direct proportion to the respective fitness value of each insertion strategy parameter. Therefore, in some embodiments, the operation that a plurality of first intermediate parameters are obtained by selecting from a plurality of insertion strategy parameters according to the respective fitness values corresponding to the plurality of insertion strategy parameters may include the following operations.

A total fitness value is obtained by performing summation operation on the respective fitness values corresponding to the plurality of insertion strategy parameters.

The respective selection probability values corresponding to the plurality of insertion strategy parameters are obtained by performing division operation on the respective fitness values corresponding to the plurality of insertion strategy parameters and the total fitness value.

A plurality of first intermediate parameters are determined according to the respective selection probability values corresponding to the plurality of insertion strategy parameters.

It is to be noted that the essence of a selecting process is to simulate natural selection. A specific selecting algorithm may be selected according to the actual application scenario, such as a roulette algorithm.

It is to be understood that the greater the respective fitness value of a insertion strategy parameter, the higher the probability that the insertion strategy parameter is selected as the first intermediate parameter, that is, one insertion strategy parameter may be selected for multiple times.

It is to be noted that, during the process of crossover and during the process of mutation, a plurality of existing mutation methods may be referred, such as one-point crossover, multi-point crossover, and uniform crossover.

In a specific embodiment, a multi-point crossover method may be adopted. Specifically, the operation that a plurality of second intermediate parameters are obtained by performing the crossover processing on the plurality of first intermediate parameters may include the following operation.

A plurality of second intermediate parameters are obtained by performing multi-point crossover processing on the plurality of first intermediate parameters according to a preset crossover probability.

It is to be noted that, in the embodiments of the disclosure, the insertion strategy parameter may be regarded as the chromosomes in the genetic algorithm. The crossover processing refers to a process that two paired chromosomes exchange part genes with each other to obtain new chromosomes. That is, in the plurality of the first intermediate parameters, every two first intermediate parameters exchange chromosome segments, i.e., part parameters, so as to obtain two second intermediate parameters after crossover exchange.

Herein, the preset crossover probability needs to be selected according to the actual application scenario.

During the process of mutation, a plurality of existing mutation methods may be adopted, such as simple mutation, uniform mutation, boundary mutation, non-uniform mutation, and Gaussian mutation.

In a specific embodiment, a Gaussian mutation method may be adopted. Specifically, the operation that a plurality of iterative insertion strategy parameters by performing mutation processing on the plurality of second intermediate parameters may include the following operations.

A random number conforming to normal distribution is determined.

A plurality of iterative insertion strategy parameters are obtained by performing, according to a preset mutation probability, Gaussian mutation processing on the plurality of second intermediate parameters by using the random number.

Thus, the iterative insertion strategy parameters may be obtained through selecting, crossover, and mutation. However, the direction of the iterative processing is not certain, that is, the iterative insertion strategy parameters may be better than the insertion strategy parameters before the iteration, or the iterative insertion strategy parameters may be worse than the insertion strategy parameters before the iteration. Therefore, it also needs to ensure that the optimal insertion strategy parameter in each generation must be completely inherited into the next generation.

In some embodiments, after the respective fitness values corresponding to plurality of insertion strategy parameters are obtained, the method may further include the following operations.

The respective fitness values corresponding to the plurality of insertion strategy parameters are compared, and the insertion strategy parameter with the highest fitness value is directly determined as an iterative insertion strategy parameter.

In other words, the selecting, iteration, crossover processing may be performed on the insertion strategy parameters of each generation to obtain the insertion strategy parameters of next generation, and the optimal insertion strategy parameter in each generation must be retained in the next generation. Thus, it can ensure that the optimal insertion strategy parameter continues to exist in an iteration process and avoid the uncertainty of iteration, so that the finally selected target insertion strategy parameter have better performance.

Moreover, according to an actual application scenario, the iteration processing may also include only selecting and crossover, or only selecting and mutation.

At S2041, 1 is added to the number of iterations, and it is determined whether the number of iterations is greater than a preset number threshold value.

Herein, for step S2041, if the determination result is no, then step S205 is performed; and if the determination result is yes, then step S206 is performed.

It is to be noted that it is necessary to determine whether the number of iterations is greater than the preset number threshold value after each iteration processing, so as to determine a subsequent processing step.

At S205, the plurality of iterative insertion strategy parameters are redetermined as the plurality of insertion strategy parameters, and the operation is returned to step S202.

It is to be noted that if the number of iterations is less than or equal to the preset number threshold value, the iteration processing is performed on the plurality of iterative insertion strategy parameters continuously.

At S206, a target insertion strategy parameter is determined according to the plurality of iterative insertion strategy parameters.

It is to be noted that if the number of iterations is greater than the preset number threshold value, the target insertion strategy parameter is selected from the plurality of iterative insertion strategy parameters.

In some embodiments, the operation that the target insertion strategy parameter is determined according to the plurality of iterative insertion strategy parameters may include the following operations.

The respective fitness values corresponding to the plurality of iterative insertion strategy parameters are obtained by calculating the plurality of iterative insertion strategy parameters by using the fitness submodel based on the circuit parameters of the circuit to be processed.

The respective fitness values corresponding to the plurality of iterative insertion strategy parameters are compared, and the iterative insertion strategy parameter with the highest fitness value is determined as the target insertion strategy parameter.

Thus, a specific implementation solution which takes the number of iterations as a termination condition is implemented. That is, the target insertion strategy parameter is obtained after a certain number of iterations are performed.

Figure 3:
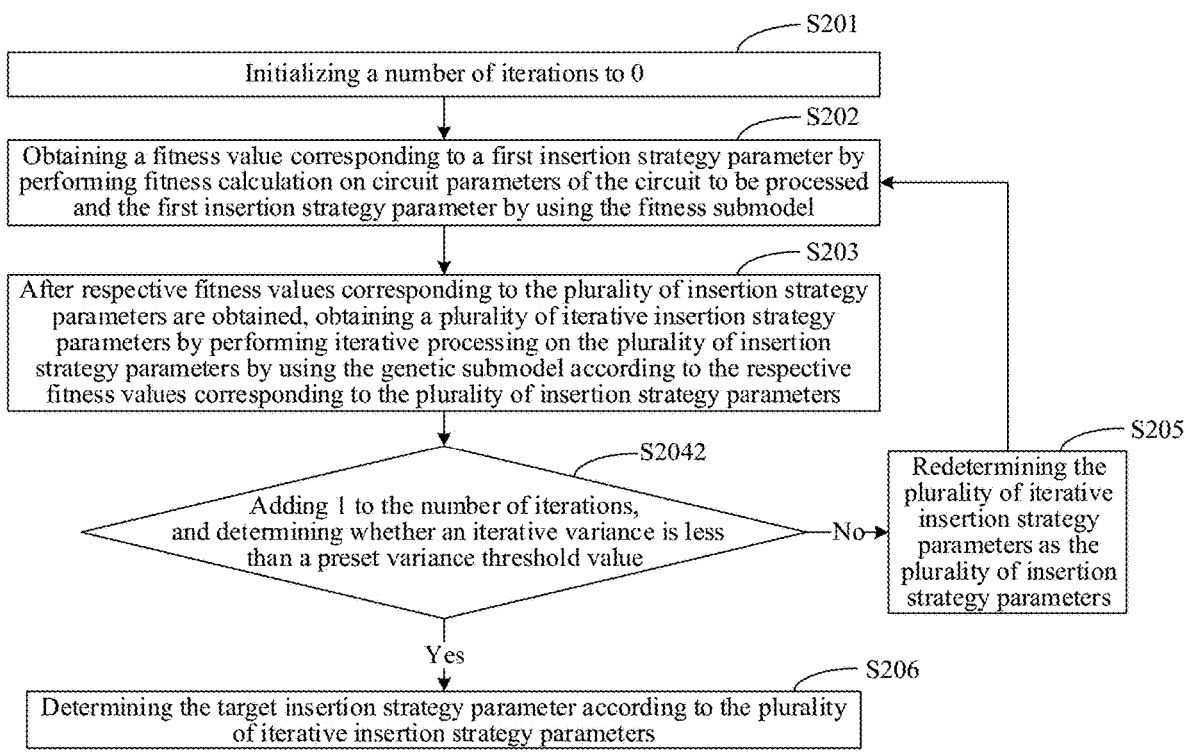
FIG. 3 illustrates a schematic flowchart of another method for buffer insertion provided by the embodiments of the disclosure.

In some other embodiments, an iterative variance may also be used as the termination condition. Therefore, as illustrated in FIG. 3, the operation that the target insertion strategy parameter is determined by calculating the plurality of insertion strategy parameters by using a preset population genetic model may include the following steps.

At S201, the number of iterations is initialized to 0.

At S202, a fitness value corresponding to a first insertion strategy parameter is obtained by performing fitness calculation on the circuit parameters of the circuit to be processed and the first insertion strategy parameter by using the fitness submodel.

At S203, after the respective fitness values corresponding to the plurality of insertion strategy parameters are obtained, a plurality of iterative insertion strategy parameters is obtained by performing iterative processing on the plurality of insertion strategy parameters by using the genetic submodel according to the respective fitness values corresponding to the plurality of insertion strategy parameters.

At S2042, 1 is added to the number of iterations, and it is determined whether the iterative variance is less than a preset variance threshold value.

Herein, for step S2042, if the determination result is no, step S205 is performed; and if the determination result is yes, step S206 is performed.

It is to be noted that the iterative variance is used to indicate the degree of variation between iteration results. If the degree variation between the iteration results in different iteration processes is large, it indicates that the iteration process needs to be continued. If the degree variation between the iteration results in different iteration processes is small, it indicates that the iteration has been repeated around the optimal solution, and the iteration process may be terminated and the optimal solution can be output.

In a specific embodiment, the iterative variance may be calculated according to the highest fitness value. Therefore, before determining whether an iterative variance is less than a preset iterative variance, the method may further include the following operations.

The highest fitness value in an n-th iteration process is obtained by comparing fitness values corresponding to the plurality of insertion strategy parameters.

The iterative variance is obtained by performing variance calculation on the highest fitness values in the (n-m)-th to n-th iterations.

Herein, n is the value of the number of iterations, and m is a positive integer.

It is to be noted that the value of m needs to be determined according to an actual application scenario. Taking m=10 as an example, the termination condition may be understood as: during the last 10 iteration processes, the highest fitness value in each generation does not change much, which indicates that the iteration has been repeated around the optimal solution; and on the contrary, if the highest fitness value in each generation changes greatly, it cannot be determined whether to find the optimal solution, and the iteration process needs to be continued.

At S205, the plurality of iterative insertion strategy parameters are redetermined as the plurality of insertion strategy parameters, and the operation is returned to step S202.

At S206, the target insertion strategy parameter is determined according to the plurality of iterative insertion strategy parameters.

Thus, a specific implementation solution which takes the degree of variation between the iteration results as a termination condition is implemented. That is, the target insertion strategy parameter is obtained when the degree of variation between the iteration results of a plurality of consecutive iterations is very small.

In particular, in an actual application process, the number of iterations may be used as the termination condition, or the iterative variance may be used as the termination condition separately, or both the number of iterations and the iterative variance may be used as the termination condition, i.e., the iteration termination may be performed when the limitation of the number of iterations is satisfied or the limitation of the degree of variation between the iteration results is satisfied.

It can be seen from the above that the fitness submodel and the genetic submodel are designed in the embodiments of the disclosure according to a genetic algorithm, and the insertion strategy parameters are controlled to evolve in the direction of better performance through multiple iteration processing for the insertion strategy parameters, and finally the target insertion strategy parameter is obtained.

At S103, a target circuit is obtained by performing buffer insertion processing on the circuit to be processed according to the target insertion strategy parameter.

It is to be noted that, according to the foregoing contents, the target insertion strategy parameter indicates the number of buffers, the insertion position of the buffer, and the size of the buffer, so that the buffer can be inserted into the circuit to be processed according to the target insertion strategy parameter, so as to obtain the target circuit.

In conclusion, according to the method for buffer insertion according to the embodiments of the disclosure, when a buffer needs to be inserted into the circuit to be processed, a plurality of insertion strategy parameters may be generated randomly, and the final target insertion strategy parameter is generated by iterating, and optimizing on the basis of the plurality of insertion strategy parameters by using a preset population genetic model. Thus, for an insertion process of the buffer in a circuit design, a circuit-aided design method is provided through the genetic algorithm, and the buffer insertion strategy can be determined automatically, so that the buffer insertion solution does not depend on the experience of a designer any longer. Moreover, the buffer insertion strategy can make the circuit have better performance, that is, the delay value of a signal is smaller, the area of the circuit is smaller, the signal quality is better, and the power consumption is lower, and the disadvantage that designer cannot quickly determine a buffer insertion rule with experience after a circuit process is replaced is avoided.

Particularly, in an embodiment, step S101 may also be considered to be performed by the preset population genetic model. In other words, a user only needs to input the circuit parameters of the circuit to be processed into the preset population genetic model, and the preset population genetic model will automatically and randomly generate a plurality of insertion strategy parameters, perform iteration and optimization on the insertion strategy parameters, and return a target insertion strategy parameter to the user after obtaining the target insertion strategy parameter.

The embodiments of the disclosure provide a buffer insertion method. A circuit to be processed and a plurality of insertion strategy parameters are determined; the target insertion strategy parameter is determined by calculating the plurality of insertion strategy parameters by using a preset population genetic model; and a target circuit is obtained by performing buffer insertion processing on the circuit to be processed according to the target insertion strategy parameter. Thus, the optimization and selection are performed on the plurality of insertion strategy parameters by using the preset population genetic model to obtain the target insertion strategy parameter with a better performance, thereby quickly completing the buffer insertion of the circuit to be processed, saving a lot of time, and having high efficiency. Furthermore, through the calculation of the preset population genetic model, the search direction of an optimal solution in a buffer insertion design can be clarified, and the obtained target insertion strategy parameter is more reasonable, which can ensure the performance of the target circuit and improve the robustness of the target circuit.

Figure 4:
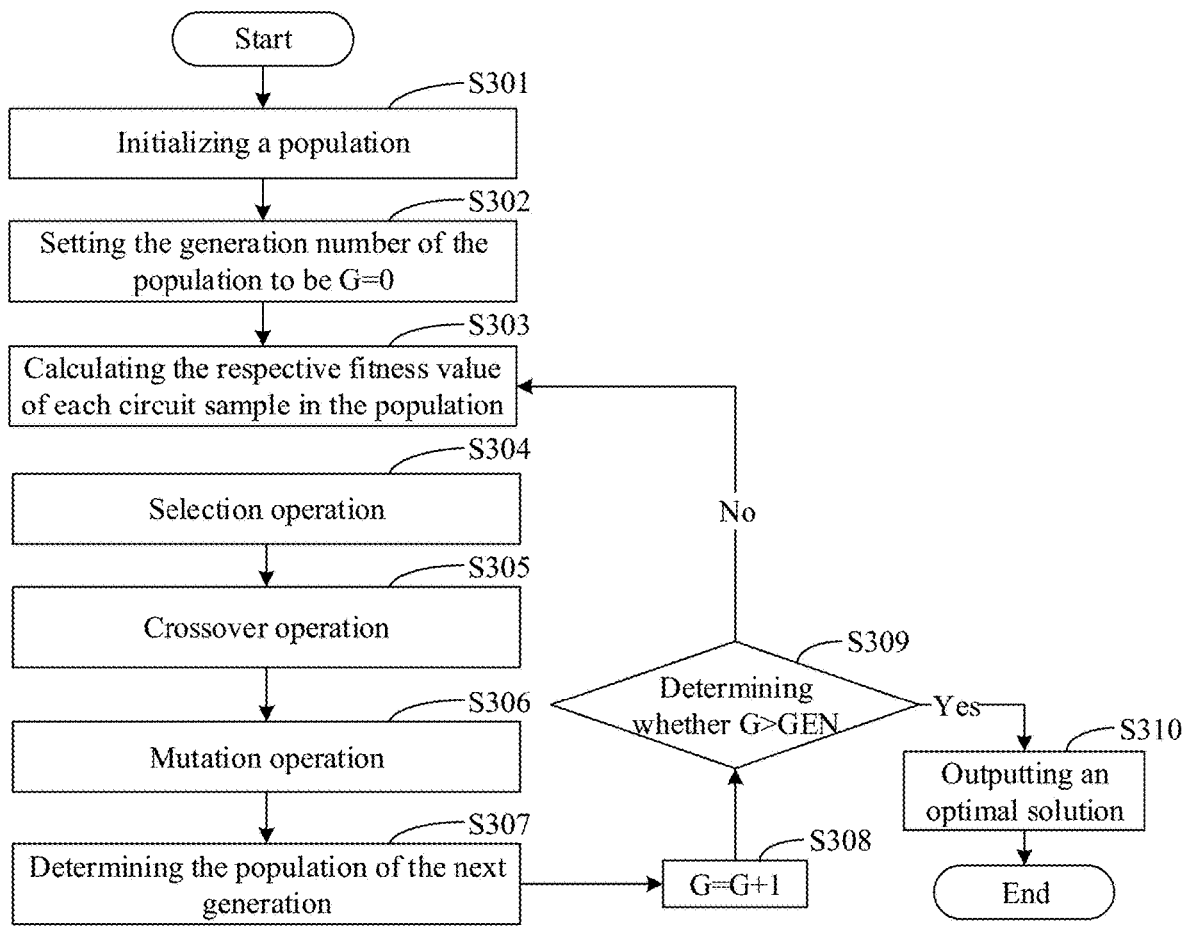
FIG. 4 illustrates a schematic flowchart of yet another method for buffer insertion provided by the embodiments of the disclosure.

In another embodiment of the disclosure, reference is made to FIG. 4, which illustrates a schematic flowchart of another method for buffer insertion provided by the embodiments of the disclosure. As illustrated in FIG. 4, the method may include the following steps.

At S301, a population is initialized.

It is to be noted that, for a circuit to be processed, 20 groups of chromosomes are generated randomly, so as to establish 20 groups of circuit samples to form an initialized population. Each group of chromosomes is equivalent to a foregoing insertion strategy parameter. The circuit sample refers to the circuit after the buffer is inserted into the circuit to be processed.

Herein, a chromosome is obtained by performing binary coding according to the insertion position of the buffer, the number of the buffers, and the type of the buffer, and is as illustrated in Formula (2).

$$\text{Chromosome}=[\text{length, size, number}] \quad (2)$$

In formula (2), length denotes the insertion position of the buffer, size denotes the size of a transistor in the buffer, and number denotes the number of the buffers.

At S302, the generation number of the population is set to be G=0.

At S303, the respective fitness value of each circuit sample in the population is calculated.

It is to be noted that the fitness submodel (or referred to as a fitness function) is established according to a signal delay, the area of the circuit, a signal pulse width, and the circuit current, which is specifically as illustrated in foregoing Formula (1).

Particularly, the weights of the signal delay, the area of the circuit, the signal pulse width, and the circuit current may be determined according to an actual application scenario. For example, if the signal delay is more concerned and the circuit current is less sensitive, the weight of the signal delay may be set as 90% and the weight of the circuit current may be set as 0.5%.

At S304, a selection operation is performed.

It is to be noted that, in the embodiments of the disclosure, the optimal retention selection is used: the probability of each circuit sample entering the next generation is equal to the proportion of the fitness value of the circuit sample to the sum of fitness values of the individuals in the whole population; and meanwhile, an individual structure with the highest fitness in the current population is completely copied to the population of the next generation.

Herein, a new individual will not be generated in a selection process, but the individual with excellent performance is selected from an original population. It should be noted that an excellent individual may be selected for a plurality of times, and a bad individual may not be selected at one time, which is a process of selecting the superior and eliminating the inferior. In other words, the circuit sample of the next generation may have three first circuit samples of the previous generation, but does not have a second circuit sample of the next generation.

Moreover, the chromosome corresponding to the selected circuit individual is equivalent to the foregoing first intermediate parameter.

At S305, a crossover operation is performed.

It is to be noted that a crossover process refers the crossover of the chromosomes corresponding to circuit samples, rather than the crossover of the circuit samples.

In the embodiments of the disclosure, the crossover operation is performed on the chromosomes corresponding to a selected circuit individual by using a multi-point crossover algorithm, so as to obtain the chromosomes after crossover. Herein, a plurality of crossover points may be set according to an actual application scenario.

Moreover, the chromosomes after the crossover are equivalent to the foregoing second intermediate parameters.

At S306, a mutation operation is performed.

It is to be noted that the mutation operation is performed on the chromosomes after the crossover, so as to obtain the mutated chromosomes. Herein, the mutated chromosomes are equivalent to iterative insertion strategy parameters.

Exemplarily, the mutation operation may use Gaussian approximate mutation, that is, when the mutation operation is performed, an original gene value is replaced by a random value that fits a normally distributed with a mean value of P and a variance of P^2. Reference may be made to the principle of a Gaussian mutation algorithm specifically, which will not be elaborated in the disclosure.

At S307, the population of the next generation is determined.

Figure 5:
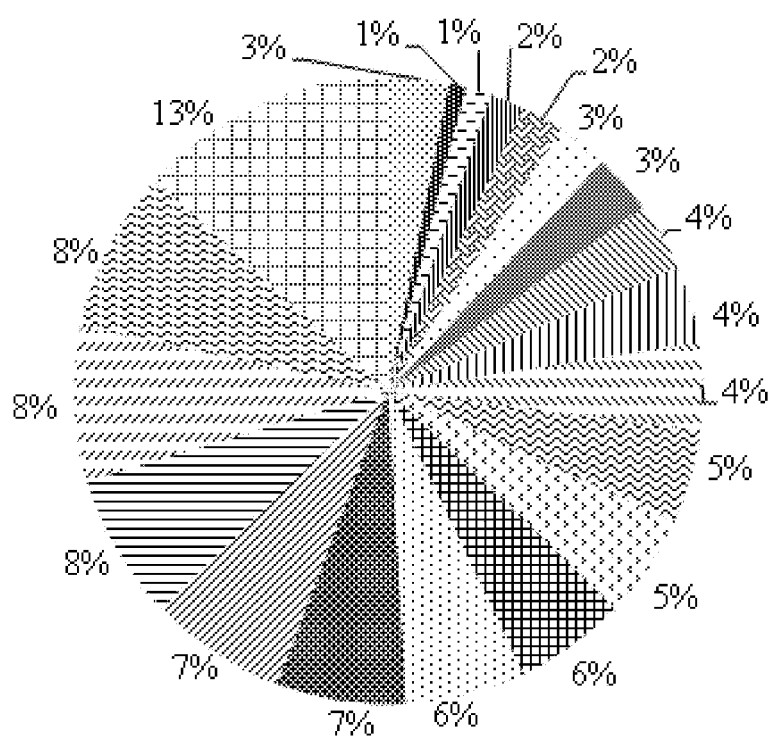
FIG. 5 illustrates a statistical schematic diagram of a fitness value provided by the embodiments of the disclosure.

In an exemplary scenario, assuming that there are 20 circuit samples in the population, a pie chart is generated according to the proportion of respective fitness values of the circuit samples to the sum of the fitness values. Reference is made to FIG. 5, which illustrates a statistical schematic diagram of fitness values provided in the embodiments of the disclosure. As illustrated in FIG. 5, in the pie chart, the proportion of the circuit sample with the largest area is 13%, and then the circuit sample will directly enter the population of the next generation. Then, the remaining circuits are selected for 19 times, and the probability that each circuit sample is selected is the percentage corresponding to the circuit individual, and then crossover and mutation are performed on the selected circuit samples to generate 19 new circuit samples, so as to form the population of the next generation. Thus, the population of the next generation still includes 20 individuals.

At S308, G=G+1.

At S309, it is determined whether G>GEN.

Herein, for step S309, if the determination result is yes, step S310 is performed. If the determination result is no, the operation is returned to perform step S303.

It is to be noted that when the number of iterations does not exceed GEN, cycle calculation needs to be performed. The GEN refers to a predetermined number of iterations, and is specified by a user according to an actual application scenario.

In addition to taking the number of iterations as the termination condition, the iterative variance may also be taken as the termination condition. Specifically, the iterative variance may refer to a variance among the highest fitness values of a plurality of continuous generations. If the iterative variance is less than a preset variance threshold value, the iteration may be terminated, and step S310 is performed.

At S310, an optimal solution is output.

It is to be noted that the circuit sample with the highest fitness value is selected from the current population for output, and the corresponding chromosome thereof is the optimal solution for buffer insertion, and is equivalent to the foregoing target insertion strategy parameter.

In conclusion, the effects (the signal delay, the total area, the signal pulse width, and the power consumption) that need to be implemented when the buffer is inserted into the circuit are set as a fitness function by using the principle of the genetic algorithm in the embodiments of the disclosure. The insertion positions of the buffers, the sizes of the buffers, and the insertion number of the buffers are taken as genes to form chromosomes. The chromosomes of each generation are subjected to selection, crossover, mutation, and loop iteration, and finally, an optimal design solution is output.

Figure 6A:
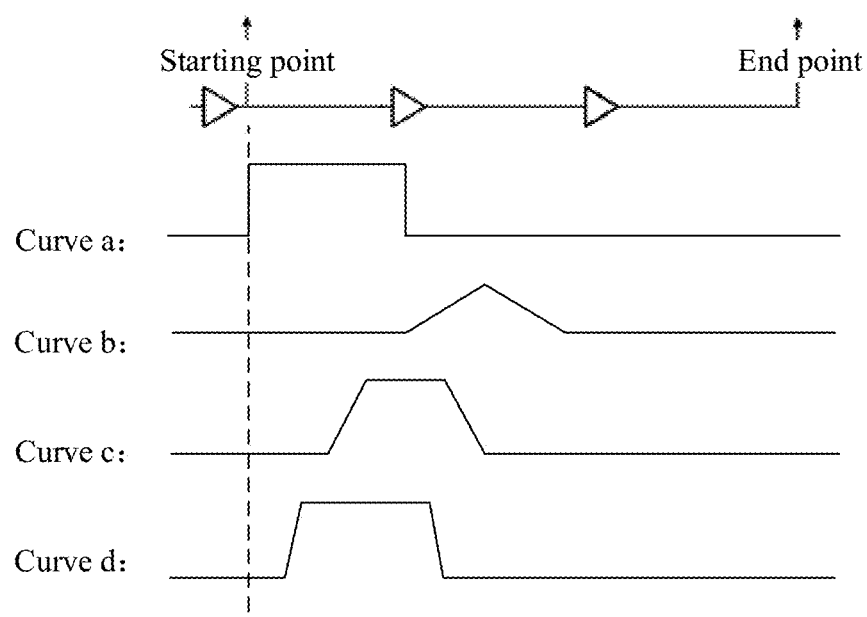
FIG. 6A illustrates a schematic diagram of the effect of buffer insertion provided by the embodiments of the disclosure.

Reference is made to FIG. 6A, which illustrates a schematic diagram of a buffer insertion effect provided by the embodiments of the disclosure. As illustrated in FIG. 6A, curve a represents a signal pulse shape in an ideal case, curve b represents a signal pulse shape after a less experienced designer inserts buffers into a circuit, curve c represents a signal pulse shape after a more experienced designer insert buffers into a circuit, and curve d represents a signal pulse shape after inserting buffers into a circuit according to the method of the embodiments of the disclosure. It can be seen from FIG. 6A that curve d is closer to curve a compared with curve b and curve c, that is, the signal delay of curve d is shorter, and the signal shape of curve d is closer to a square wave, that is, the pulse width of the signal is greater. Therefore, the signal quality of curve d is the best.

Figure 6B:
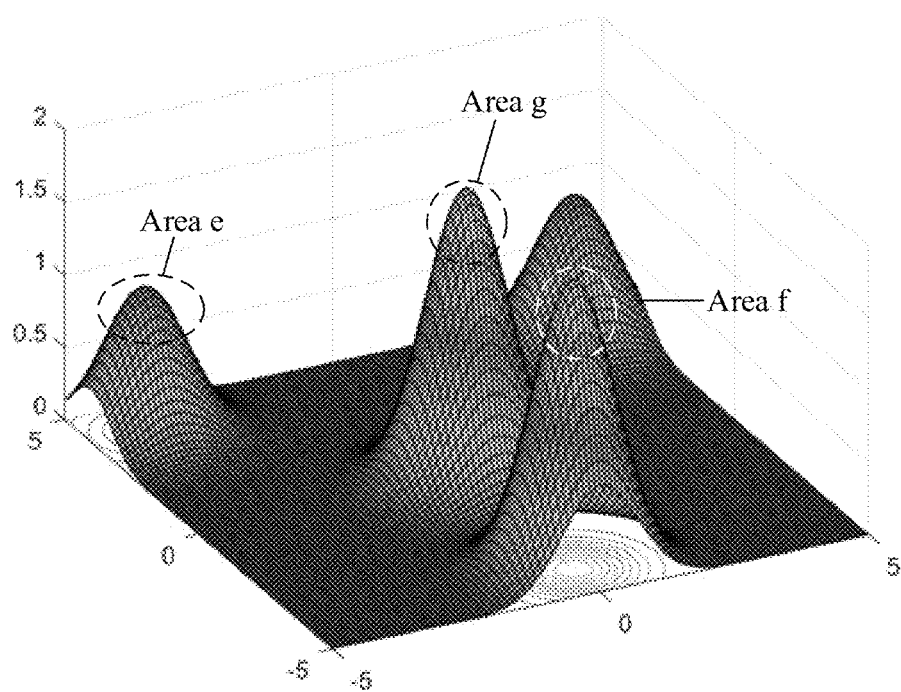
FIG. 6B illustrates a schematic diagram of another effect of buffer insertion provided by the embodiments of the disclosure.

Reference is made to FIG. 6B, which illustrates a schematic diagram of another buffer insertion effect provided by the embodiments of the disclosure. As illustrated in FIG. 6B, area e represents the circuit performance after a less experienced designer inserts buffers into a circuit, area f represents the circuit performance after a more experienced designer inserts buffers into a circuit, and area g represents the circuit performance after inserting buffers into a circuit by the method of the embodiments of the disclosure. It can be seen from FIG. 6B that the circuit performance of area g is the best.

It can be seen from FIG. 6A and FIG. 6B that an optimal solution of a buffer insertion strategy can be found quickly in a process of inserting the buffers into the circuit by the method provided by the embodiments of the disclosure, which is beneficial to a subsequent circuit design and improves the robustness of the circuit.

The embodiments of the disclosure provide a method for buffer insertion. Specific implementation methods of the foregoing embodiments are elaborated through the present embodiment. It can be seen that the plurality of insertion strategy parameters are optimized and selected by using the preset population genetic model to obtain the target insertion strategy parameter with a better effect, thereby quickly completing the buffer insertion of the circuit to be processed, saving a lot of time, and having high efficiency. Furthermore, through the calculation of the preset population genetic model, the search direction of an optimal solution in a buffer insertion design can be clarified, and the obtained target insertion strategy parameter is more reasonable, which can ensure the performance of the target circuit and improve the robustness of the target circuit.

Figure 7:
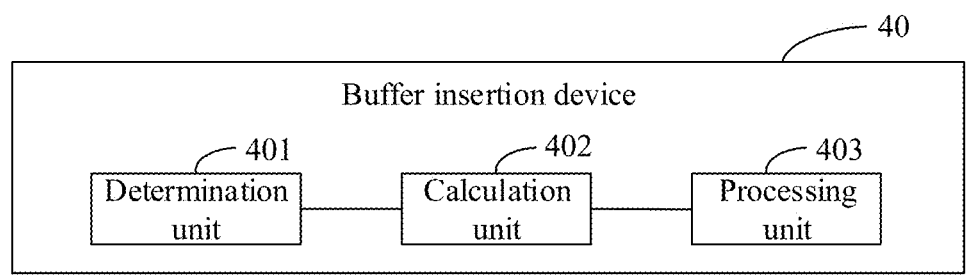
FIG. 7 illustrates a composition structure schematic diagram of a device for buffer insertion provided by the embodiments of the disclosure.

In another embodiment of the disclosure, reference is made to FIG. 7, which illustrates a composition structure schematic diagram of a buffer insertion device 40 provided by the embodiments of the disclosure. As illustrated in FIG. 7, the buffer insertion device 40 may include: a determination unit 401, a calculation unit 402, and a processing unit 403.

The determination unit 401 is configured to determine a circuit to be processed and a plurality of insertion strategy parameters.

The calculation unit 402 is configured to determine a target insertion strategy parameter by calculating the plurality of insertion strategy parameters by using a preset population genetic model.

The processing unit 403 is configured to obtain a target circuit by performing buffer insertion processing on the circuit be processed according to the target insertion strategy parameter.

In some embodiments, an insertion strategy parameter includes a buffer quantity parameter, a buffer position parameter, and a buffer size parameter.

In some embodiments, the preset population genetic model includes a fitness submodel and a genetic submodel. Correspondingly, the calculation unit 402 is configured to: initialize the number of iterations to 0; obtain a fitness value corresponding to a first insertion strategy parameter by performing fitness calculation on circuit parameters of the circuit to be processed and a first insertion strategy parameter by using the fitness submodel, herein the first insertion strategy parameter is any one of the plurality of insertion strategy parameters; after obtaining the respective fitness values corresponding to the plurality of insertion strategy parameters, obtain a plurality of iterative insertion strategy parameters by performing iterative processing on the plurality of insertion strategy parameters by using the genetic submodel according to the respective fitness values corresponding to the plurality of insertion strategy parameters; add 1 to the number of iterations, and determine whether the number of iterations is greater than a preset number threshold value; in a case where the number of iterations is less than or equal to the preset number threshold value, redetermine the plurality of iterative insertion strategy parameters as the plurality of insertion strategy parameters, and return to the step that the fitness calculation is performed on the circuit parameters of the circuit to be processed and the first insertion strategy parameter by using the fitness submodel; and in a case where the number of iterations is greater than the preset number threshold value, determine the target insertion strategy parameter according to the plurality of iterative insertion strategy parameters.

In some embodiments, the preset population genetic model includes a fitness submodel and a genetic submodel. Correspondingly, the calculation unit 402 is configured to: initialize the number of iterations to 0; obtain a fitness value corresponding to a first insertion strategy parameter by performing fitness calculation on circuit parameters of the circuit to be processed and a first insertion strategy parameter by using the fitness submodel, herein the first insertion strategy parameter is any one of the plurality of insertion strategy parameters; after obtaining the respective fitness values corresponding to the plurality of insertion strategy parameters, obtain a plurality of iterative insertion strategy parameters by performing iterative processing on the plurality of insertion strategy parameters by using the genetic submodel according to the respective fitness values corresponding to the plurality of insertion strategy parameters; add 1 to the number of iterations, and determine whether an iterative variance is less than a preset iterative variance; in a case where the iterative variance is greater than or equal to the preset iterative variance, redetermine the plurality of iterative insertion strategy parameters as the plurality of insertion strategy parameters, and return the operation to the step that the fitness calculation is performed on the circuit parameters of the circuit to be processed and the first insertion strategy parameter by using the fitness submodel; and in a case where the iterative variance is less than the preset iterative variance, determine the target insertion strategy parameter according to the plurality of iterative insertion strategy parameters.

In some embodiments, the calculation unit 402 is further configured to: obtain a highest fitness value in an n-th iteration process by comparing the respective fitness values corresponding to the plurality of iterative insertion strategy parameters; and obtain the iterative variance by performing variance calculation on the highest fitness values in an (n-m)-th iteration to the n-th iteration, herein n is the value of the number of iterations, and m is a positive integer.

In some embodiments, the calculation unit 402 is further configured to: compare the respective fitness values corresponding to the plurality of insertion strategy parameters, and directly determine the insertion strategy parameter with the highest fitness value as an iterative insertion strategy parameter.

In some embodiments, the calculation unit 402 is further configured to: obtain a first sub-fitness value, a second sub-fitness value, a third sub-fitness value, and a fourth sub-fitness value by calculating the circuit parameters of the circuit to be processed and the first insertion strategy parameter, and obtain the fitness value corresponding to the first insertion strategy parameter by performing weighted summation operation on the first sub-fitness value, the second sub-fitness value, the third sub-fitness value, and the fourth sub-fitness value by using preset weight values.

In some embodiments, the preset weight values include a first weight value, a second weight value, a third weight value, and a fourth weight value. Correspondingly, the calculation unit 402 is further configured to: set respective values of the first weight value, the second weight value, the third weight value, and the fourth weight value, herein the sum of the respective values of the first weight value, the second weight value, the third weight value, and the fourth weight value is 1, the first weight value refers to the weight value of the first sub-fitness value, the second weight value refers to the weight value of the second sub-fitness value, the third weight value refers to the weight value of the third sub-fitness value, and the fourth weight value refers to the weight value of the fourth sub-fitness value.

In some embodiments, the calculation unit 402 is further configured to: obtain a plurality of first intermediate parameters by selecting from the plurality of insertion strategy parameters according to the respective fitness values corresponding to the plurality of insertion strategy parameters; obtain a plurality of second intermediate parameters by performing crossover processing on the plurality of first intermediate parameters; and obtain the plurality of iterative insertion strategy parameters by performing mutation processing on the plurality of second intermediate parameters.

In some embodiments, the calculation unit 402 is further configured to: obtain a total fitness value by performing summation operation on the respective fitness values corresponding to the plurality of insertion strategy parameters; obtain respective selection probability values corresponding to the plurality of insertion strategy parameters by performing division operation on the respective fitness values corresponding to the plurality of insertion strategy parameters and the total fitness value, and determine the plurality of first intermediate parameters according to the respective selection probability values corresponding to the plurality of insertion strategy parameters.

In some embodiments, the calculation unit 402 is further configured to obtain the plurality of second intermediate parameters by performing multi-point crossover processing on the plurality of first intermediate parameters according to a preset crossover probability.

In some embodiments, the calculation unit 402 is further configured to: determine a random number conforming to normal distribution; and obtain the plurality of iterative insertion strategy parameters by performing, according to a preset mutation probability, Gaussian mutation processing on the plurality of second intermediate parameters by using the random number.

In some embodiments, the processing unit 403 is further configured to: obtain the respective fitness values corresponding to the plurality of iterative insertion strategy parameters by calculating, based on the circuit parameters of a circuit to be processed, on the plurality of iterative insertion strategy parameters by using the fitness submodel; and compare the respective fitness values corresponding to the plurality of iterative insertion strategy parameters, and determine the iterative insertion strategy parameter with the highest fitness value as the target insertion strategy parameter.

It is to be understood that, in the present embodiment, "unit" can be part of the circuit, part of the processor, part of the program or software, etc., of course, it can also be a module or non-modular. Furthermore, various constituent parts in the embodiments may be integrated into one processing unit, or each of the units may exist alone physically, or two or more units are integrated into one unit. The integrated unit may be implemented in a form of hardware, or may be implemented in a form of a software functional module.

When the integrated unit is implemented in the form of software function module and is not sold or used as an independent product, it can be stored in a computer readable storage medium. Based on such an understanding, the technical solutions of the embodiment essentially, or the part contributing to some implementations, or all or some of the technical solutions may be implemented in a form of a software product. The software product is stored in a storage medium and includes several instructions for instructing a computer device (which may be a personal computer, a server, a network device, or the like) or a processor perform all or some of the steps of the methods described in the embodiments. The foregoing storage medium includes: various medium capable of storing program codes, such as a USB flash disc, a mobile hard disc, a Read Only Memory (ROM), a magnetic disc, or a compact disc.

Therefore, the embodiment provides a computer storage medium having stored a computer program which, when executed by a plurality of processors, causes the processor to implement the steps of the method according to any one of the foregoing embodiments.

Figure 8:
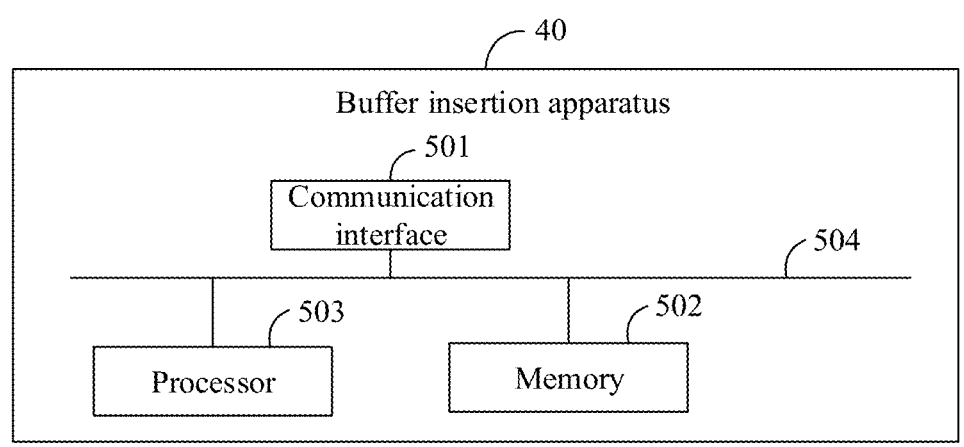
FIG. 8 illustrates a structure schematic diagram of the hardware of the device for buffer insertion provided by the embodiments of the disclosure.

Based on the composition of the abovementioned buffer insertion device 40 and the computer storage medium, reference is made to FIG. 8, which illustrates a structure schematic diagram of the hardware of an buffer insertion device 40 provided by the embodiments of the disclosure. As illustrated in FIG. 8, a buffer insertion device 40 may include: a communication interface 501, a memory 502, and a processor 503. Various components are coupled together through a bus device 504. It is to be understood that the bus device 504 is used to implement connection and communication between these components. In addition to a data bus, the bus device 504 further includes a power bus, a control bus, and a state signal bus. However, for clarity of description, various buses are marked as the bus device 504 in FIG. 8. The communication interface 501 may be configured to receive and send a signal during the process of sending and receiving information with other network elements.

The memory 502 is configured to store a computer program executable on the processor 503.

The processor 503 is configured to execute the following operations when executing the computer program.

A circuit to be processed and a plurality of insertion strategy parameters are determined.

The target insertion strategy parameter is determined by calculating the plurality of insertion strategy parameters by using a preset population genetic model.

A target circuit is obtained by performing buffer insertion processing on the circuit to be processed according to the target insertion strategy parameter.

It is to be understood that the memory 502 in the embodiment of the disclosure may be a volatile memory or a non-volatile memory, or may include both a volatile memory and a non-volatile memory. The non-volatile memory may be a Read-Only Memory (ROM), a Programmable ROM (PROM), an Erasable PROM (EPROM), an Electrically EPROM (EEPROM), or a flash memory. The volatile memory may be a Random Access Memory (RAM), which is used as an external high-speed cache. By way of example but not restrictive description, many forms of RAMs may be used, for example, a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous link DRAM (SLDRAM), and a Direct Rambus RAM (DRRAM). The memory 502 of the device and the method described in the disclosure is intended to include but not be limited to these and any other applicable types of memories.

The processor 503 may be an integrated circuit chip, which has signal processing capability. During implementation, the steps of the foregoing method can be performed by integrated logic circuits of the hardware in the processor 503 or instructions in the form of software. The abovementioned processor 503 may be a general-purpose processor, a digital signal processor (Digital Signal Processor, DSP), an application specific integrated circuit (Application Specific Integrated Circuit, ASIC), a field programmable gate array (Field Programmable Gate Array, FPGA) or other programmable logic devices, a discrete gate or transistor logic device, or a discrete hardware component. The processor can implement or execute the methods, steps, and logical block diagrams disclosed in the embodiments of the disclosure. The general-purpose processor may be a microprocessor, or the processor may be any conventional processor or the like. The steps of the method disclosed with reference to the embodiments of the disclosure may be directly executed and completed by a hardware decoding processor, or executed and completed by a combination of hardware and software modules in a decoding processor. The software module may be located in a storage medium mature in the art, such as a random access memory, a flash memory, a read-only memory, a programmable read-only memory or electrically erasable programmable memory, or a register. The storage medium is located in a memory 502. The processor 503 reads information in the memory 502, and completes the steps of the foregoing method in combination with its hardware.

It is to be understood that these embodiments described in the disclosure may be implemented by hardware, software, firmware, middleware, microcode, or a combination thereof. For hardware implementation, the processing unit may be implemented in one or more Application Specific Integrated Circuits (ASICs), Digital Signal Processors (DSP), Digital Signal Processing Devices (DSPDs), Programmable Logic Devices (PLDs), Field-Programmable Gate Arrays (FPGAs), general-purpose processors, controllers, microcontrollers, microprocessors, and other electronic units for performing the functions described in the disclosure, or a combination thereof.

For software implementation, the technologies described in the embodiments of the disclosure may be implemented by modules (for example, processes or functions) that perform the functions described in the embodiments of the disclosure. A software code may be stored in the memory and executed by the processor. The memory may be implemented in or outside the processor.

Optionally, as another embodiment, the processor 503 is also configured to execute the steps of the method of any one of the foregoing embodiments when running the computer program.

Figure 9:
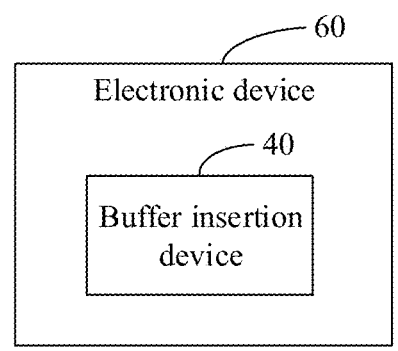
FIG. 9 illustrates a composition structure schematic diagram of an electronic device provided by the embodiments of the disclosure.

In yet another embodiment of the disclosure, based on the composition diagram of the abovementioned device for buffer insertion 40, reference is made to FIG. 9, which illustrates a composition structure schematic diagram of an electronic device 60 provided by the embodiments of the disclosure. As illustrated in FIG. 9, the electronic device 60 includes at least the buffer insertion device 40 of any one of the foregoing embodiments.

For the electronic device 60, since it includes the buffer insertion device 40, a plurality of insertion strategy parameters are optimized and selected by using a preset population genetic model, so as to obtain a target insertion strategy parameter with a better effect, thereby quickly completing the buffer insertion of the circuit to be processed, saving a lot of time, and having high efficiency. Furthermore, through the calculation of the preset population genetic model, the search direction of an optimal solution in a buffer insertion design can be clarified, and the obtained target insertion strategy parameter is more reasonable, which can ensure the performance of the target circuit and improve the robustness of the target circuit.

The foregoing descriptions are only preferred embodiments of the disclosure and are not intended to limit the scope of protection of the disclosure.

It is to be noted that, herein, terms "include" and "contain" or any other variants thereof are intended to cover nonexclusive inclusions, so that, a process, a method, an article, or a device including a series of elements not only includes those elements but also includes other elements which are not clearly listed or further includes intrinsic elements of the process, the method, the article, or the device. Under the condition of no more limitations, an element defined by a statement "including a/an . . . " does not exclude existence of additional same elements in the process, the method, or the apparatus.

The serial numbers of the embodiments of the disclosure are not to represent superiority-inferiority of the embodiments but only for description.

The methods disclosed in several method embodiments provided in the disclosure may be freely combined without conflicts to obtain new method embodiments.

The characteristics disclosed in several product embodiments provided in the disclosure may be freely combined without conflicts to obtain new product embodiments.

The characteristics disclosed in several method or device embodiments provided in the disclosure may be freely combined without conflicts to obtain new method embodiments or device embodiments.

The abovementioned descriptions are only specific implementation manners of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

The embodiments of the disclosure provide a method and device for buffer insertion, a storage medium, and an electronic device. A circuit to be processed and a plurality of insertion strategy parameters are determined. The target insertion strategy parameter is determined by calculating the plurality of insertion strategy parameters by using a preset population genetic model. A target circuit is obtained by performing buffer insertion processing on the circuit to be processed according to the target insertion strategy parameter. Thus, the plurality of insertion strategy parameters are optimized and selected by using the preset population genetic model to obtain the target insertion strategy parameter with a better effect, thereby quickly completing the buffer insertion of the circuit to be processed, saving a lot of time, and having high efficiency. Furthermore, through the calculation of the preset population genetic model, the search direction of an optimal solution in a buffer insertion design can be clarified, and the obtained target insertion strategy parameter is more reasonable, which can ensure the performance of the target circuit and improve the robustness of the target circuit.

What is claimed is:

1. A method for buffer insertion, comprising:
    determining a circuit to be processed and a plurality of insertion strategy parameters;
    determining a target insertion strategy parameter by calculating the plurality of insertion strategy parameters by using a preset population genetic model; and
    obtaining a target circuit by performing buffer insertion processing on the circuit to be processed according to the target insertion strategy parameter;
    wherein the preset population genetic model comprises a fitness submodel and a genetic submodel; and determining the target insertion strategy parameter by calculating the plurality of insertion strategy parameters by using the preset population genetic model comprises:
    initializing a number of iterations to 0;
    obtaining a fitness value corresponding to a first insertion strategy parameter by performing fitness calculation on circuit parameters of the circuit to be processed and the first insertion strategy parameter by using the fitness submodel, wherein the first insertion strategy parameter is any one of the plurality of insertion strategy parameters;
    after respective fitness values corresponding to the plurality of insertion strategy parameters are obtained, obtaining a plurality of iterative insertion strategy parameters by performing iterative processing on the plurality of insertion strategy parameters by using the genetic submodel according to the respective fitness values corresponding to the plurality of insertion strategy parameters;
    adding 1 to the number of iterations, and determining whether the number of iterations or an iterative variance meet a preset condition.

2. The method for buffer insertion of claim 1, wherein an insertion strategy parameter comprises a buffer quantity parameter, a buffer position parameter, and a buffer size parameter.

3. The method for buffer insertion of claim 1, wherein determining whether the number of iterations or the iterative variance meet the preset condition comprises:
    determining whether the number of iterations is greater than a preset number threshold value;
    in a case where the number of iterations is less than or equal to the preset number threshold value, redetermining the plurality of iterative insertion strategy parameters as the plurality of insertion strategy parameters, and returning to the step of performing the fitness calculation on the circuit parameters of the circuit to be processed and the first insertion strategy parameter by using the fitness submodel; and
    in a case where the number of iterations is greater than the preset number threshold value, determining the target insertion strategy parameter according to the plurality of iterative insertion strategy parameters.

4. The method for buffer insertion of claim 3, wherein after obtaining the respective fitness values corresponding to the plurality of insertion strategy parameters, the method further comprises:
    comparing the respective fitness values corresponding to the plurality of insertion strategy parameters, and directly determining an insertion strategy parameter with a highest fitness value as an iterative insertion strategy parameter.

5. The method for buffer insertion of claim 3, wherein obtaining the fitness value corresponding to the first insertion strategy parameter by performing fitness calculation on the circuit parameters of the circuit to be processed and the first insertion strategy parameter by using the fitness submodel comprises:
    obtaining a first sub-fitness value, a second sub-fitness value, a third sub-fitness value, and a fourth sub-fitness value by calculating the circuit parameters of the circuit to be processed and the first insertion strategy parameter; and
    obtaining the fitness value corresponding to the first insertion strategy parameter by performing a weighted summation operation on the first sub-fitness value, the second sub-fitness value, the third sub-fitness value, and the fourth sub-fitness value by using preset weight values.

6. The method for buffer insertion of claim 5, wherein the preset weight values comprise a first weight value, a second weight value, a third weight value, and a fourth weight value; and the method further comprises:
    setting respective values of the first weight value, the second weight value, the third weight value, and the fourth weight value, wherein the sum of the respective values of the first weight value, the second weight value, the third weight value, and the fourth weight value is 1;

the first weight value refers to a weight value of the first sub-fitness value, the second weight value refers to a weight value of the second sub-fitness value, the third weight value refers to a weight value of the third sub-fitness value, and the fourth weight value refers to a weight value of the fourth sub-fitness value.

7. The method for buffer insertion of claim 3, wherein obtaining the plurality of iterative insertion strategy parameters by performing iterative processing on the plurality of insertion strategy parameters by using the genetic submodel according to the respective fitness values corresponding to the plurality of insertion strategy parameters comprises:

obtaining a plurality of first intermediate parameters by selecting from the plurality of insertion strategy parameters according to the respective fitness values corresponding to the plurality of insertion strategy parameters;

obtaining a plurality of second intermediate parameters by performing crossover processing on the plurality of first intermediate parameters; and obtaining the plurality of iterative insertion strategy parameters by performing mutation processing on the plurality of second intermediate parameters.

8. The method for buffer insertion of claim 7, wherein obtaining the plurality of first intermediate parameters by selecting from the plurality of insertion strategy parameters according to the respective fitness values corresponding to the plurality of insertion strategy parameters comprises:

obtaining a total fitness value by performing summation operation on the respective fitness values corresponding to the plurality of insertion strategy parameters;

obtaining respective selection probability values corresponding to the plurality of insertion strategy parameters by performing division operation on the respective fitness values corresponding to the plurality of insertion strategy parameters and the total fitness value; and determining the plurality of first intermediate parameters according to the respective selection probability values corresponding to the plurality of insertion strategy parameters.

9. The method for buffer insertion of claim 7, wherein obtaining the plurality of second intermediate parameters by performing crossover processing on the plurality of first intermediate parameters comprises:

obtaining the plurality of second intermediate parameters by performing multi-point crossover processing on the plurality of first intermediate parameters according to a preset crossover probability.

10. The method for buffer insertion of claim 7, wherein obtaining the plurality of iterative insertion strategy parameters by performing mutation processing on the plurality of second intermediate parameters comprises:

determining a random number conforming to normal distribution; and obtaining the plurality of iterative insertion strategy parameters by performing, according to a preset mutation probability, Gaussian mutation processing on the plurality of second intermediate parameters by using the random number.

11. The method for buffer insertion of claim 10, wherein determining the target insertion strategy parameter according to the plurality of iterative insertion strategy parameters comprises:

obtaining the respective fitness values corresponding to the plurality of iterative insertion strategy parameters by calculating, based on the circuit parameters of a circuit to be processed, the plurality of iterative insertion strategy parameters by using the fitness submodel; and comparing the respective fitness values corresponding to the plurality of iterative insertion strategy parameters, and determining an iterative insertion strategy parameter with a highest fitness value as a target insertion strategy parameter.

12. The method for buffer insertion of claim 1, wherein determining whether the number of iterations or the iterative variance meet the preset condition comprises:

determining whether the variance is less than a preset variance threshold value;

in a case where the iterative variance is greater than or equal to the preset a variance threshold value, redetermining the plurality of iterative insertion strategy parameters as the plurality of insertion strategy parameters, and returning to a step of performing the fitness calculation on the circuit parameters of the circuit to be processed and the first insertion strategy parameter by using the fitness submodel; and in a case where the number of iterations is greater than the preset variance threshold value, determining the target insertion strategy parameter according to the plurality of iterative insertion strategy parameters.

13. The method for buffer insertion of claim 12, wherein before determining whether the iterative variance is less than the preset iterative variance, the method further comprises:

obtaining a highest fitness value in an n-th iteration process by comparing the respective fitness values corresponding to the plurality of insertion strategy parameters; and obtaining the iterative variance by performing variance calculation on highest fitness values in (n-m)-th to n-th iterations, wherein n is a value of the number of iterations, and m is a positive integer.

14. The method for buffer insertion of claim 12, wherein after obtaining the respective fitness values corresponding to the plurality of insertion strategy parameters, the method further comprises:

comparing the respective fitness values corresponding to the plurality of insertion strategy parameters, and directly determining an insertion strategy parameter with a highest fitness value as an iterative insertion strategy parameter.

15. The method for buffer insertion of claim 12, wherein obtaining the fitness value corresponding to the first insertion strategy parameter by performing fitness calculation on the circuit parameters of the circuit to be processed and the first insertion strategy parameter by using the fitness submodel comprises:

obtaining a first sub-fitness value, a second sub-fitness value, a third sub-fitness value, and a fourth sub-fitness value by calculating the circuit parameters of the circuit to be processed and the first insertion strategy parameter; and obtaining the fitness value corresponding to the first insertion strategy parameter by performing a weighted summation operation on the first sub-fitness value, the second sub-fitness value, the third sub-fitness value, and the fourth sub-fitness value by using preset weight values.

16. The method for buffer insertion of claim 15, wherein the preset weight values comprise a first weight value, a second weight value, a third weight value, and a fourth weight value; and the method further comprises:
   setting respective values of the first weight value, the second weight value, the third weight value, and the fourth weight value, wherein the sum of the respective values of the first weight value, the second weight value, the third weight value, and the fourth weight value is 1;
   the first weight value refers to a weight value of the first sub-fitness value, the second weight value refers to a weight value of the second sub-fitness value, the third weight value refers to a weight value of the third sub-fitness value, and the fourth weight value refers to a weight value of the fourth sub-fitness value.

17. The method for buffer insertion of claim 12, wherein obtaining the plurality of iterative insertion strategy parameters by performing iterative processing on the plurality of insertion strategy parameters by using the genetic submodel according to the respective fitness values corresponding to the plurality of insertion strategy parameters comprises:
   obtaining a plurality of first intermediate parameters by selecting from the plurality of insertion strategy parameters according to the respective fitness values corresponding to the plurality of insertion strategy parameters;
   obtaining a plurality of second intermediate parameters by performing crossover processing on the plurality of first intermediate parameters; and
   obtaining the plurality of iterative insertion strategy parameters by performing mutation processing on the plurality of second intermediate parameters.

18. The method for buffer insertion of claim 17, wherein obtaining the plurality of first intermediate parameters by selecting from the plurality of insertion strategy parameters according to the respective fitness values corresponding to the plurality of insertion strategy parameters comprises:
   obtaining a total fitness value by performing summation operation on the respective fitness values corresponding to the plurality of insertion strategy parameters;
   obtaining respective selection probability values corresponding to the plurality of insertion strategy parameters by performing division operation on the respective fitness values corresponding to the plurality of insertion strategy parameters and the total fitness value; and
   determining the plurality of first intermediate parameters according to the respective selection probability values corresponding to the plurality of insertion strategy parameters.

19. A device for buffer insertion, comprising a memory and a processor, wherein the memory is configured to store a computer program executable on the processor; and
   the processor is configured to:
   determine a circuit to be processed and a plurality of insertion strategy parameters;
   determine a target insertion strategy parameter by calculating the plurality of insertion strategy parameters by using a preset population genetic model; and
   obtain a target circuit by performing buffer insertion processing on the circuit to be processed according to the target insertion strategy parameter;
   wherein the preset population genetic model comprises a fitness submodel and a genetic submodel; and determine the target insertion strategy parameter by calculating the plurality of insertion strategy parameters by using the preset population genetic model comprises:
   initialize a number of iterations to 0;
   obtain a fitness value corresponding to a first insertion strategy parameter by performing fitness calculation on circuit parameters of the circuit to be processed and the first insertion strategy parameter by using the fitness submodel, wherein the first insertion strategy parameter is any one of the plurality of insertion strategy parameters;
   after respective fitness values corresponding to the plurality of insertion strategy parameters are obtained, obtain a plurality of iterative insertion strategy parameters by performing iterative processing on the plurality of insertion strategy parameters by using the genetic submodel according to the respective fitness values corresponding to the plurality of insertion strategy parameters;
   add 1 to the number of iterations, and determine whether the number of iterations or an iterative variance meet a preset condition.

20. A non-transitory computer-readable storage medium having stored a computer program which, when executed by a processor, causes the processor to perform a method for buffer insertion; the method comprising:
   determining a circuit to be processed and a plurality of insertion strategy parameters;
   determining a target insertion strategy parameter by calculating the plurality of insertion strategy parameters by using a preset population genetic model; and
   obtaining a target circuit by performing buffer insertion processing on the circuit to be processed according to the target insertion strategy parameter;
   wherein the preset population genetic model comprises a fitness submodel and a genetic submodel; and determining the target insertion strategy parameter by calculating the plurality of insertion strategy parameters by using the preset population genetic model comprises:
   initializing a number of iterations to 0;
   obtaining a fitness value corresponding to a first insertion strategy parameter by performing fitness calculation on circuit parameters of the circuit to be processed and the first insertion strategy parameter by using the fitness submodel, wherein the first insertion strategy parameter is any one of the plurality of insertion strategy parameters;
   after respective fitness values corresponding to the plurality of insertion strategy parameters are obtained, obtaining a plurality of iterative insertion strategy parameters by performing iterative processing on the plurality of insertion strategy parameters by using the genetic submodel according to the respective fitness values corresponding to the plurality of insertion strategy parameters;
   adding 1 to the number of iterations, and determining whether the number of iterations or an iterative variance meet a preset condition.

* * * * *